(12) United States Patent
Park

(10) Patent No.: US 7,271,645 B2
(45) Date of Patent: Sep. 18, 2007

(54) SMART CHARGE-PUMP CIRCUIT FOR PHASE-LOCKED LOOPS

(75) Inventor: Sangbeom Park, Tracy, CA (US)

(73) Assignee: ANA Semiconductor, Tracy, CA (US)

( * ) Notice: Subject to any disclaimer, the term of this patent is extended or adjusted under 35 U.S.C. 154(b) by 69 days.

(21) Appl. No.: 11/241,311

(22) Filed: Sep. 30, 2005

(65) Prior Publication Data
US 2007/0075755 A1  Apr. 5, 2007

(51) Int. Cl.
G05F 3/02 (2006.01)

(52) U.S. Cl. .................. 327/536; 327/148; 363/59
(58) Field of Classification Search ............ 327/148, 327/157
See application file for complete search history.

(56) References Cited

U.S. PATENT DOCUMENTS 5,179,356 A * 1/1993 Kroner ............... 330/288
5,359,296 A * 10/1994 Brooks et al. .......... 330/288
6,160,432 A * 12/2000 Rhee et al. ............ 327/157
6,535,051 B2 * 3/2003 Kim .................... 327/536
6,586,976 B2 * 7/2003 Yang ................... 327/157
7,005,896 B2 * 2/2006 Chen et al. ............. 327/112
2004/0066220 A1 * 4/2004 Chen .................... 327/157
2006/0132208 A1 * 6/2006 Park .................... 327/182
2006/0226917 A1 * 10/2006 Park ..................... 331/16

* cited by examiner

Primary Examiner—Kenneth B. Wells
Assistant Examiner—Ryan C. Jager

(57) ABSTRACT

The smart charge-pump circuits basically include a high-performance charge-pump circuit as well as a smart lock-in circuit. After the smart charge-pump circuit sensors an initial condition and responds accordingly, it will begin to operate fully as a high performance charge-pump.

20 Claims, 4 Drawing Sheets

SMART CHARGE-PUMP CIRCUIT FOR PHASE-LOCKED LOOPS

FIELD OF THE INVENTION

The present invention relates to the field of charge-pump circuit and more particularly to smart charge-pump circuit for phase-locked loops.

BACKGROUND ART

Phase-looked loop is a vitally important device. Phase-looked loop is analog and mixed signal building block used extensively in communication, networks, digital systems, consumer electronics, computers, and any other fields that require frequency synthesizing, clock recovery, and synchronization.

Prior Art FIG. 1 illustrates a block diagram of a conventional phase-locked loop. The conventional phase-locked loop 100 typically consists of a phase-frequency detector (or phase detector), a charge-pump 120, a low-pass filter, and a voltage-controlled oscillator in a loop. Phase-locked loops without any frequency divider in a loop are considered here for simplicity. The phase-frequency detector (or phase detector) is a block that has an output voltage with an average value proportional to the phase difference between the input signal and the output signal of the voltage-controlled oscillator. The charge-pump either injects the charge into the low-pass filter or subtracts the charge from the low-pass filter, depending on the outputs of the phase-frequency detector (or phase detector). Therefore, change in the low-pass filter's output voltage drives the voltage-controlled oscillator. The negative feedback of the loop results in the output of the voltage-controlled oscillator being synchronized with the input signal. As a result, the phase-locked loop is in lock.

The conventional charge-pump circuit 120 of Prior Art FIG. 1 is illustrated. Assuming the upper charge-pump current source and the lower charge-pump current source are equal in magnitude, the average current flowing into the output node $V_C$ or flow out of the output node $V_c$ is expressed as $$I_{AVG} = \frac{\Delta\Phi_{IN}}{2\pi} I_{CH}$$

where $\Delta\Phi_{IN}$ is the phase difference. When MOS switches turn off, charge-injection errors occur. The conventional charge-pump circuit 120 provides direct charge-injection error into the output node $V_C$ because the drain of the MOS switch is coupled to the output node $V_C$. In addition, the conventional charge-pump including circuit 120 has only a function of chare-pumping. For these reasons, the conventional charge-pump circuit 120 of Prior Art FIG. 1 is not the best choice to implement in an integrated circuit (IC) or system-on-chip (SOC).

Thus, what is desperately needed is a smart charge-pump circuit that can be highly efficiently implemented with a drastic improvement in lock-in time, design time, cost, chip area, charge-injection errors, charge-pump offset, effective current injection, and chare-sharing problem. The present invention satisfies these needs by providing smart charge-pump circuits.

SUMMARY OF THE INVENTION

The present invention provides three types of the smart charge-pump circuits for phase-locked loops. The basic architecture of a smart charge-pump circuit consists of two switch mirror circuits (or two current mirror circuits), two switches, two current source transistors, n adders and n sensors where n ranges from 1 to 2. Since switch mirrors or current mirrors are employed, transistor charge injection and clock feed through to the output is greatly reduced.

Consequently, all smart charge-pump circuits achieve a drastic improvement in lock-in time, design time, cost, chip area, charge-injection errors, charge-pump offset, effective current injection, and chare-sharing problem.

BRIEF DESCRIPTION OF THE DRAWINGS

The accompanying drawings, which are incorporated in and form a part of this specification, illustrate three embodiments of the invention and, together with the description, serve to explain the principles of the invention.

Prior Art

DESCRIPTION OF THE PREFERRED EMBODIMENTS

In the following detailed description of the present invention, three types of the smart charge-pump circuits, numerous specific details are set forth in order to provide a thorough understanding of the present invention. However, it will be obvious to one skilled in the art that the present invention may be practiced without these specific details. In other instances, well known methods, procedures, CMOS digital gates, components, and metal-oxide-semiconductor field-effect transistor (MOSFET) device physics have not been described in detail so as not to unnecessarily obscure aspects of the present invention.

Figure 1:
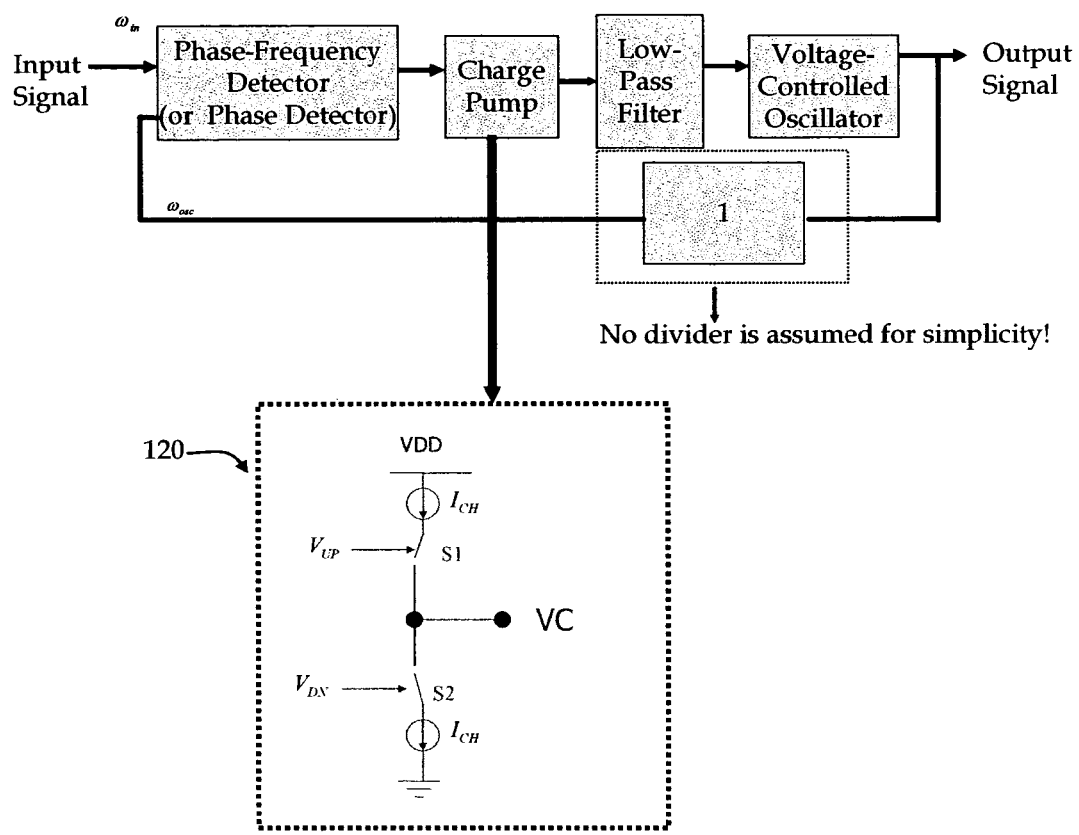
FIG. 1 illustrates a block diagram of a conventional phase-locked loop with a conventional charge-pump circuit.
Figure 2:
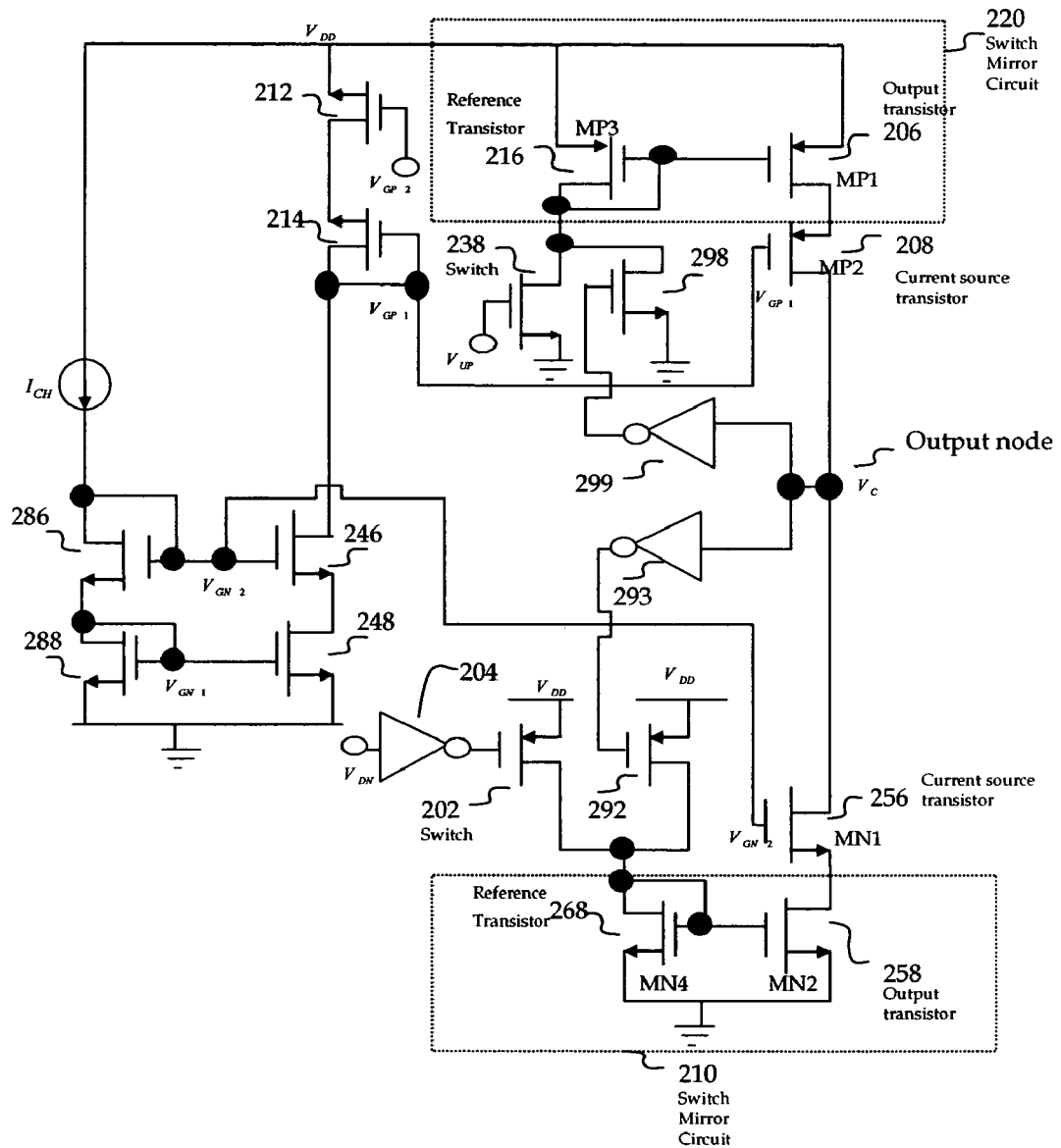
FIG. 2 illustrates a block diagram of a simple smart charge-pump circuit for phase-locked loops in accordance with the present invention.

To reduce the problems of a conventional charge-pump circuit 120 and enhance fast-locking capability, FIG. 2 illustrates a block diagram of a simple smart charge-pump circuit 200 for phase-locked loops according to the present invention. This simple smart charge-pump circuit 200 has not only a high performance charge-pumping function but also a fast-locking function. The charge-pump circuit 200 does not have power-down mode in order to show the fundamental concept of the invention clearly. The simple smart charge-pump circuit is composed of two parts. The first one consists of a PMOS current source transistor 208, a PMOS switch mirror circuit 220, an NMOS switch 238, an NMOS adder 298, and a low-voltage sensing inverter 299. The second one consists of an NMOS current source 256, an NMOS switch mirror circuit 210, a PMOS switch 202, a PMOS transistor adder 292, and a high-voltage sensing inverters 293. The gate terminal (i.e., $V_{GP2}$) of a PMOS transistor 212 is connected to its drain or ground (e.g., "0", low, etc.). In conventional current mirror circuits the reference current is conveyed to the output current assuming both reference transistor and output transistor are the same size. However, in the switch mirror circuits used in FIG. 2, a switch coupled to a diode-connected reference transistor indirectly controls a current source coupled to the output. The great advantage of this simple smart charge-pump circuit 200 is to utilize the switch mirror circuits 220 and 210 as a part of building cascodes at the output.

The NMOS switch 238 is placed between ground and the drain of a diode-connected PMOS reference transistor 216 and the PMOS switch 202 is placed between power supply and the drain of a diode-connected NMOS reference transistor 268. In addition, the drain node and the gate node of the NMOS adder 298 are connected to the drain of the diode-connected PMOS reference transistor 216 and the output of the sensing inverter 299, respectively. Likewise, the drain node and the gate node of the PMOS adder 292 are connected to the drain of the diode-connected NMOS reference transistor 268 and the output of the sensing inverter 293. Each of current source transistors 208 and 256 is coupled between the output node of the simple smart charge-pump circuit 200 and an output transistor 206 or 258. Thus, clock feed-through is very low because the MOS switches 238 and 202 and MOS adders 298 and 292 are separated far from any high impedance output node. At the same time, it is noted that the drain nodes of the switches and adders are tied together to be connected to the drain nodes of the diode-connected reference transistors which have lower impedance.

Up and down signals (i.e., $V_{UP}$ and $V_{DN}$) from the phase-frequency detector (or phase detector) control the gate voltages of the MOS switches 238 and 202, which mirror the switching action through switch mirror circuits 220 and 210, respectively, in order to control the currents of two current source transistors 208 and 256. Since the resistances looking into from the source node of the PMOS current source 208 and NMOS current source 256 are not high, a long fall time of the current pulses does not occur. Furthermore, when MOS switches turn off, charge-injection errors occur. The charge-injection error due to channel charge is given by $Q_{CH}=WLC_{OX}(V_{GS}-V_T)$. However, the channel charges of the output transistors 206 and 258 are very small because the output transistors 206 and 258 are not completely turned off due to small ($V_{GS}-V_T$). Thus, a very small charge injection and a clock feed-though are not directly conveyed to the output node because the current source transistors 208 and 256 are located between the output node and switch mirror circuits. By stacking PMOS transistors 206 and 208 and NMOS transistors 256 and 258, the output impedance is increased for effective current injection.

It is assumed that up and down signals (i.e., $V_{UP}$ and $V_{DN}$) from the phase-frequency detector (or phase detector) are not effective at the initial condition of phase-locked loop and the amount of current caused by up or down signals is very small to be ignored. The lower-voltage sensing inverter 299 senses a voltage at the output assuming the output of the circuit 200 is at ground. Since the lower-voltage sensing inverter 299 initially senses the voltage less than the midpoint voltage of the lower-voltage sensing inverter 299, the output voltage of the lower-voltage sensing inverter 299 is high enough to turn on the NMOS adder 298. At the same time, the output voltage of the higher-voltage sensing inverter 293 is high enough to turn off the PMOS adder 292. Thus, the NMOS adder 298 provides a current, $I_n$, to the output through the PMOS switch mirror 220 until the output voltage, $V_C$, goes up to the midpoint voltage, which is decided by the device aspect ratios of the lower-voltage sensing inverter 299. The time to reach the midpoint voltage at the filter is simply equal to the charge stored at the filter divided by the current. A multiple-order filter is assumed to be approximated to the first-order filter with neglecting resistor in the filter for simplicity. Thus, the time to reach the midpoint voltage at the filter connected between $V_C$ and ground is as follows:

$$\Delta t = \frac{V_M C_P}{I_n}$$

where $V_M$ is the midpoint voltage determined by the device aspect ratios of the lower-voltage sensing inverter 299 and $C_P$ is the value of the capacitor in the filter. Thus, the lock-in time of the phase-locked loops including the filter connected between $V_C$ and ground is approximately given by $$\frac{(\omega_{in} - \omega_M)^2}{\omega_0^3} + \frac{V_M C_P}{I_n}$$

where $\omega_{in}$ is the input signal frequency, $\omega_M$ is the voltage-controlled oscillator's frequency for $V_C=V_M$, and $\omega_0$, is the loop bandwidth. The lock-in time varies primarily depending on the device aspect ratio of the NMOS adder 298.

Likewise, the higher-voltage sensing inverter 293 senses a voltage at the output assuming the output of the circuit 200 is at power supply. Since the higher-voltage sensing inverter 293 initially senses the voltage greater than the higher midpoint voltage of the higher-voltage sensing inverter 293, the output voltage of the higher-voltage sensing inverter 293 is low enough to turn on the PMOS adder 292. At the same time, the output voltage of the lower-voltage sensing inverter 299 is low enough to turn off the NMOS adder 298. Thus, the PMOS adder 292 provides a PMOS current, $I_p$, to the output through the NMOS switch mirror 210 until the output voltage, $V_C$, goes down to the higher midpoint voltage, which is decided by the device aspect ratios of the higher-voltage sensing inverter 293. The time to reach the midpoint voltage at the filter connected between $V_C$ and power supply is simply equal to the charge stored at the filter divided by the current. A multiple-order filter is assumed to be approximated to the first-order filter with neglecting resistor in the filter for simplicity. Thus, the time to reach the higher midpoint voltage at the filter connected between $V_C$ and power supply is as follows:

$$\Delta t = \frac{(V_{DD} - V_{M(H)})C_P}{I_P}$$

where $V_{M(H)}$ is the higher midpoint voltage determined by the device aspect ratios of the higher-voltage sensing inverter 293 and $C_P$ is the value of the capacitor in the filter. Thus, the lock-in time of the phase-locked loops including the filter connected between Vc and power supply is approximately given by $$\frac{(\omega_{in} - \omega_{M(H)})^2}{\omega_0^3} + \frac{(V_{DD} - V_{M(H)})C_P}{I_P}$$

where $\omega_{in}$, is the input signal frequency, $\omega_{M(H)}$ is the voltage-controlled oscillator's frequency for $V_C = V_{M(H)}$ and $\omega_0$ is the loop bandwidth. This lock-in time varies primarily depending on the device aspect ratio of the PMOS adder 292.

The midpoint voltage is a voltage where the input voltage and the output voltage of the inverter are equal in the voltage transfer characteristic. At the midpoint voltage, the transistors of the inverter operate in the saturation mode. This midpoint voltage of inverter is expressed as $$\frac{V_{DD} - V_{T_n} - |V_{T_p}|}{1 + \sqrt{\frac{K_n}{K_p}}} + V_{T_n} \text{ where } \frac{K_n}{K_p} = \frac{\mu_n C_{OX}\left(\frac{W}{L}\right)_n}{\mu_n C_{OX}\left(\frac{W}{L}\right)_p}$$

In addition, the capacitors can be added to the drain node of the adders 298 and 292, respectively to attenuate glitches since they provide additional paths to ground.

In design of the circuit of FIG. 2, it is also desirable to use a value for the midpoint voltage, $V_M$, less than $V'_C$ and a value for the higher midpoint voltage, $V_{M(H)}$, greater than $V'_C$. $V'_C$ is the voltage that makes the frequency of the voltage-controlled oscillator equal to the input signal's frequency. The CMOS process variations usually must be considered so that the proper value of the midpoint voltage is chosen for the circuit of FIG. 2.

After the simple smart chare-pump circuit 200 of FIG. 2 senses the initial condition and, thus, quickly reaches the targeted midpoint voltage at the output node in a very smart way, the simple smart chare-pump circuit 200 does the same charge-pumping function as the conventional charge-pump circuits do.

Figure 3:
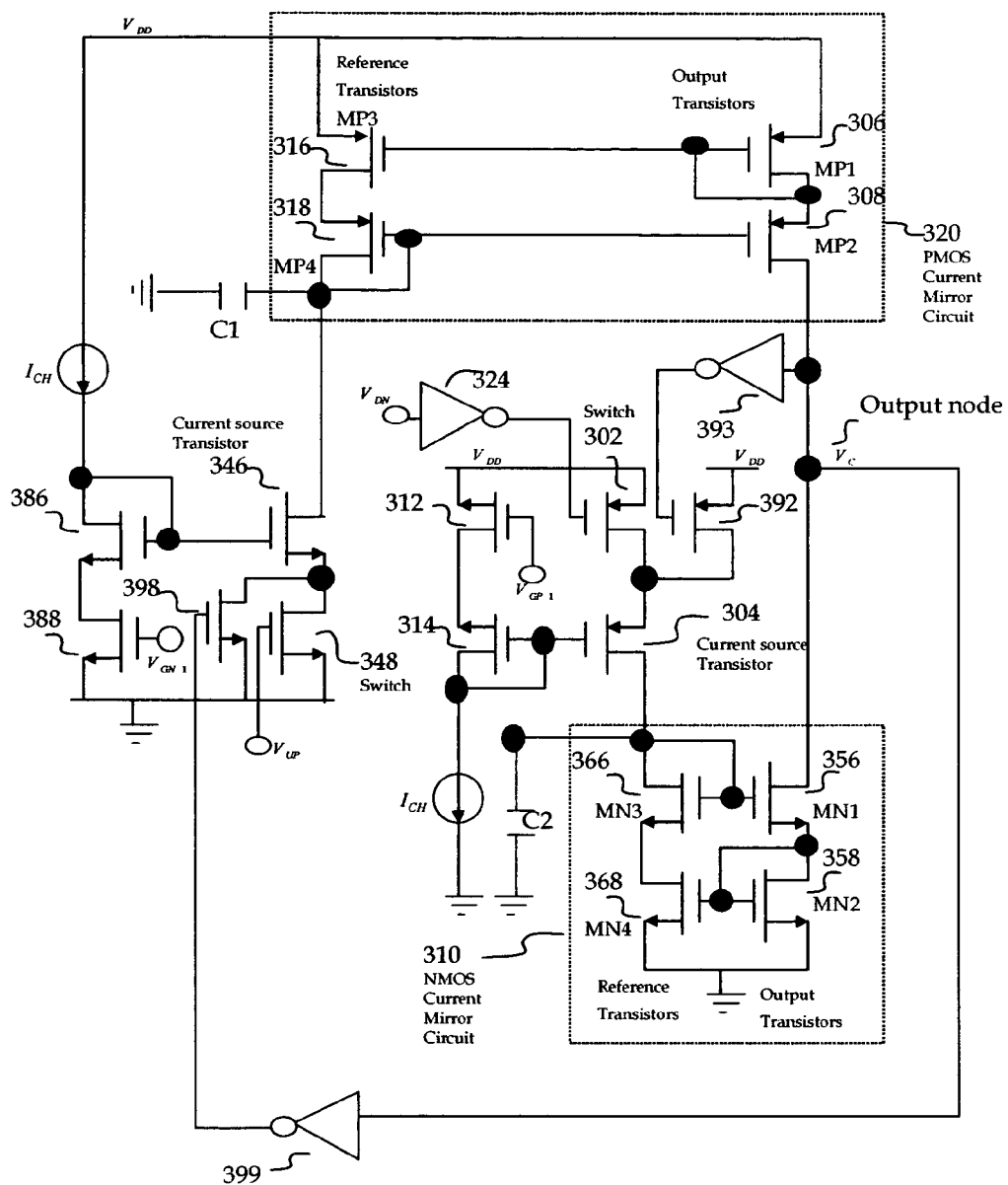
FIG. 3 illustrates a circuit diagram of a cascode smart charge-pump circuit for phase-locked loops according to the present invention.

FIG. 3 illustrates a block diagram of a cascode smart charge-pump circuit for phase-locked loops according to the present invention. This cascode smart charge-pump circuit 300 does not have power-down mode in order to show the fundamental concept of the invention clearly. The cascode smart charge-pump circuit 300 is basically composed of two parts. The first part consists of a PMOS Wilson current mirror 320, a current source transistor 346 and an NMOS switch 348, an NMOS adder transistor 398, and a low-voltage sensing inverter 399. The second part consists of an NMOS Wilson current mirror 310, a current source transistor 304 and a PMOS switch 302, a PMOS adder 392, and a high voltage sensing inverter 393. It is noted that the NMOS adder 398 is placed between ground and the source node of an NMOS current source transistor 346. In addition, the PMOS adder transistor 392 is placed between power supply and the source node of a PMOS current source transistor 304. The gate terminal (i.e., $V_{GN1}$) of an NMOS transistor 388 is connected to it drain or power supply (e.g., "1", high, $V_{DD}$, etc.). In addition, the gate terminal (i.e., $V_{GP1}$) of a PMOS transistor 312 is connected to it drain or ground (e.g., "0", low, etc.).

It is assumed that up and down signals (i.e., $V_{UP}$ and $V_{DN}$) from the phase-frequency detector (or phase detector) are not properly provided at the initial condition of phase-locked loop and the amount of current caused by up or down signals is ignored here for convenience. The lower-voltage sensing inverter 399 senses a voltage at the output assuming the output of the circuit 300 is at ground. Since the lower-voltage sensing inverter 399 initially senses the voltage less than the midpoint voltage of the lower-voltage sensing inverter 399, the output voltage of the lower-voltage sensing inverter 399 is high enough to turn on the NMOS adder 398. At the same time, the output voltage of the higher-voltage sensing inverter 393 is high enough to turn off the PMOS adder 392. Thus, the NMOS adder 398 provides a current to the output through the PMOS Wilson current mirror 320 until the output voltage, $V_C$, goes up to the midpoint voltage, which is decided by the device aspect ratios of the lower-voltage sensing inverter 399.

Likewise, the higher-voltage sensing inverter 393 senses a voltage at the output assuming the output of the circuit 300 is at power supply. Since the higher-voltage sensing inverter 393 initially senses the voltage greater than the higher midpoint voltage of the higher-voltage sensing inverter 393, the output voltage of the higher-voltage sensing inverter 393 is low enough to turn on the PMOS adder 392. At the same time, the output voltage of the lower-voltage sensing inverter 399 is low enough to turn off the NMOS adder 398. Thus, the PMOS adder 392 provides a PMOS current to the output through the NMOS Wilson current mirror 310 until the output voltage, $V_C$, goes down to the higher midpoint voltage, which is decided by the device aspect ratios of the higher-voltage sensing inverter 393. Thus, the mathematical formulas of the cascode charge-pump circuit shown in FIG. 3 are the same as those of the circuit shown in FIG. 2.

After the cascode smart chare-pump circuit 300 of FIG. 3 senses the initial condition and, thus, quickly reaches the targeted midpoint voltage at the output node in a very smart way, the cascode smart chare-pump circuit 300 does the same charge-pumping function as the conventional charge-pump circuits do. The up and down signals (i.e., $V_{UP}$ and $V_{DN}$) from the phase-frequency detector (or phase detector) steer the current from the NMOS current source transistor 346 and the PMOS current source transistor 304 into the Wilson current mirror circuits that mirror the charging and discharging currents into the output node. Since the NMOS switch 348 and PMOS switch 302 are placed very far from any high impedance output node, clock feed-through is very low. In the Wilson current mirrors the resistance looking into from the source node of the PMOS transistor 308 and NMOS transistor 356 is not high because the diode-connected transistors 306 and 358 are coupled to the source nodes. As a result, a long fall time of the current pulses does not occur. Since the cascode smart charge-pump circuit of the invention uses the MOS adders 398 and 392 with inverters 399 and 393, the circuit has an additional fast-locking function.

Figure 4:
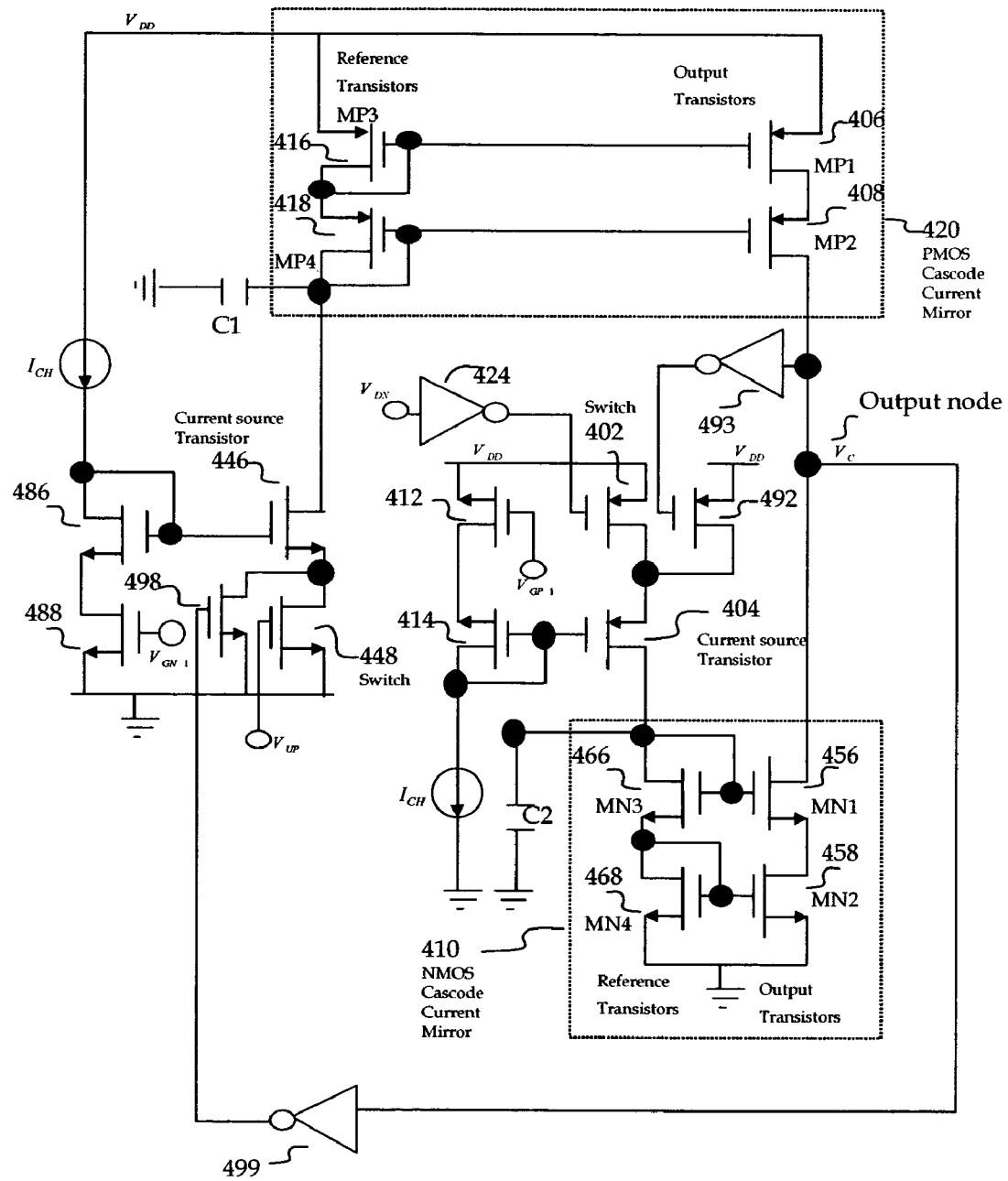
FIG. 4 illustrates a circuit diagram of a modified high-swing smart charge-pump circuit for phase-locked loops in accordance with the present invention.

FIG. 4 illustrates a block diagram of a modified high-swing smart charge-pump circuit for phase-locked loops according to the present invention. This modified high-swing smart charge-pump circuit 400 does not have power-down mode in order to show the fundamental concept of the invention clearly. The modified high-swing smart charge-pump circuit 400 is a modification of the cascode smart charge-pump circuit 300 and has wide-swing current mirrors. The operations and principles of the modified high-swing smart charge-pump circuits shown in FIG. 4 are the same as those of the circuit shown in FIG. 3. Compared to FIG. 3, the first difference to note is that the Wilson current mirrors 320 and 310 are replaced by the cascode current mirrors 420 and 410, respectively, in order to provide the higher swing at the output. The resistance looking into from the source node of the PMOS transistor 408 and NMOS transistor 456 is somewhat increased because any diode-connected transistors are not coupled to the source nodes. However, since the PMOS transistor 408 and NMOS transistor 456 are not switches but current mirror transistors, charge-injection is greatly reduced.

In summary, the three smart charge-pump circuits of the present invention utilize not only the switch mirror circuit or indirect switching action to achieve a high-performance charge-pump function but also smarts sensing and reacting to obtain fast-locking function using the small number of transistors. Therefore, the three smart charge-pump circuits achieve a drastic improvement in lock-in time, design time, cost, chip area, charge-injection errors, effective current injection, and charge-sharing problem. In particular, three smart charge-pump circuits 200, 300, and 400 are highly effective for obtaining both a fast lock-in time and a great reduction of charge injection.

In addition, in order to reduce the charge-pump offset, a differential architecture of charge-pump is conventionally adopted. This type of differential charge-pump requires a unity-gain buffer to be placed between two output nodes for the purpose of keeping the two output nodes at the same potential and thus reduces the charge-pump offset. However, differential charge-pump with the unity-gain buffer takes a large chip area and the unity-gain buffer can introduce random offset to cause the charge-pump offset. For these reasons, the differential charge-pump is not the one of best choices for high performance. Therefore, the three smart charge-pump circuits of the present invention not only save chip area but also provide a high-performance.

Those skilled in the art will recognize that with minor modifications, these input schemes may be reversed with the down input terminal as the up input terminal and the up input terminal serving as the down input terminal.

All the smart charge-pump circuits of the present invention are very efficient to implement in system-on-chip (SOC) or integrated circuit (IC). In addition, these smart charge-pump circuits of the present invention are very indispensable for numerous phase-locked loop applications. The present invention provides three different embodiments which achieve a drastic improvement in lock-in time, design time, cost, chip area, charge-injection errors, effective current injection, and charge-sharing problem. While the present invention has been described in particular embodiments, it should be appreciated that the present invention should not be construed as being limited by such embodiments, but rather construed according to the claims below.

What is claimed is:

1. A smart charge-pump circuit for receiving complementary signals with smart sensing and generating a current flowing into or flowing out of an output node, comprising:
   two current source transistors coupled to the output node for providing the current to the output node;
   two switch mirror circuits coupled to the two current source transistors, each of the two switch mirror circuits receiving and sending a switching action to a different one of the two current source transistors; and
   two switches and two adders sharing drain nodes coupled to the two switch mirror circuits, each switch and each adder providing the switching action to a different one of the two switch mirror circuits.

2. The circuit as recited in claim 1 further comprising two sensors coupled between the output node and the two adders, one sensor for each adder wherein the two sensors sense the output node and generate corresponding output voltages to the two adders.

3. The circuit as recited in claim 2 wherein each of the two sensors is an odd number of inverter gates.

4. The circuit as recited in claim 2 wherein the two sensors are comparators.

5. The circuit as recited in claim 1 wherein the two switches are MOS transistors.

6. The circuit as recited in claim 1 wherein the two switches are CMOS transistors.

7. The circuit as recited in claim 1 wherein each of the two switch mirror circuits consists of a diode-connected reference transistor and an output transistor.

8. The circuit as recited in claim 7 further comprising capacitors coupled to drain nodes of the diode-connected reference transistors, one capacitor for each diode-connected reference transistor wherein the capacitors provide additional paths to ground to attenuate glitches.

9. The circuit as recited in claim 1 wherein the smart charge-pump circuit is applied to all phase-locked loops without regard to architectures, topologies, and schematics.

10. A smart charge-pump circuit for receiving complementary signals with smart sensing and generating a current flowing into or flowing out of an output node, comprising:
    two current mirror circuits coupled to the output node for mirroring the current;
    two current source transistors directly coupled to the two current mirror circuits, each of the two current source transistors supplying the current to a different one of the two current mirror circuits; and
    two switches and two adders sharing drain nodes coupled to the two current source transistors, each switch and each adder directly controlling a source node of a different one of the two current source transistors.

11. The circuit as recited in claim 10 further comprising two sensors coupled between the output node and the two adders, one sensor for each adder wherein the two sensors sense the output node and generate corresponding output voltages to the two adders.

12. The circuit as recited in claim 11 wherein each of the two sensors is an odd number of inverter gates.

13. The circuit as recited in claim 11 wherein the two sensors are comparators.

14. The circuit as recited in claim 10 wherein the two switches are MOS transistors.

15. The circuit as recited in claim 10 wherein the two switches are CMOS transistors.

16. The circuit as recited in claim 10 wherein the two current mirror circuits are cascode current mirror circuits.

17. The circuit as recited in claim 10 wherein the two current mirror circuits are Wilson current mirror circuits.

18. The circuit as recited in claim 10 wherein the two current mirror circuits are simple current mirror circuits.

19. The circuit as recited in claim 10 further comprising capacitors coupled to drain nodes of the two current source transistors, one capacitor for each of the two current source transistors wherein the capacitors provide additional paths to ground to attenuate glitches.

20. The circuit as recited in claim 10 wherein the smart charge-pump circuit is applied to all phase-locked loops without regard to architectures, topologies, and schematics.

* * * * *